United States Patent [19]

Kita et al.

[11] 4,275,138
[45] Jun. 23, 1981

[54] PHOTOSENSITIVE DIAZONIUM COMPOUND CONTAINING COMPOSITION AND ARTICLE WITH β-HYDROXYALKYL ACRYLATE OR METHACRYLATE

[75] Inventors: Nobuyuki Kita; Yasuhisa Narutomi, both of Udawara, Japan

[73] Assignees: Fuji Photo Film Co., Ltd., Tokyo, Japan; National Patent Development Corp., New York, N.Y.

[21] Appl. No.: 723,061

[22] Filed: Sep. 14, 1976

Related U.S. Application Data

[63] Continuation of Ser. No. 489,434, Jul. 17, 1974, abandoned.

[30] Foreign Application Priority Data

Jul. 23, 1973 [JP] Japan ................... 48-82850

[51] Int. Cl.³ .................. G03C 1/60; G03C 1/76; G03C 1/94
[52] U.S. Cl. .................. 430/157; 430/158; 430/171; 430/175; 430/176; 430/177; 430/183; 430/271; 430/278; 430/302; 430/325; 430/910; 430/927; 430/292
[58] Field of Search ............ 96/75, 91 R, 91 D, 91 N, 96/115 R, 35.1, 33, 36, 36.3; 430/157, 158, 171, 175, 176, 271, 278, 302, 325, 910, 927

[56] References Cited

U.S. PATENT DOCUMENTS

| | | | |
|---|---|---|---|
| 2,937,085 | 5/1960 | Seven et al. | 96/75 |
| 3,060,023 | 10/1962 | Burg et al. | 96/35.1 |
| 3,418,295 | 12/1968 | Schoenthaler | 96/115 R |
| 3,544,317 | 12/1970 | Yonezawa | 96/75 |
| 3,549,373 | 12/1970 | Homada et al. | 96/75 |
| 3,625,744 | 12/1971 | Juna et al. | 96/91 R |
| 3,660,097 | 5/1972 | Mainthia | 96/91 R |
| 3,679,419 | 7/1972 | Gillich | 96/91 R |
| 3,715,211 | 2/1973 | Quaintance | 96/115 P |
| 3,732,105 | 5/1973 | Klupfel et al. | 96/115 R |
| 3,733,200 | 5/1973 | Takaishi et al. | 96/75 |
| 3,778,270 | 12/1973 | Roos | 96/91 R |
| 3,790,382 | 2/1974 | Dahlmar | 96/75 |
| 3,837,860 | 9/1974 | Roos | 96/91 D |
| 3,841,874 | 10/1974 | Nishino | 96/91 R |
| 3,847,610 | 11/1974 | Laridon et al. | 96/35.1 |
| 3,859,099 | 1/1975 | Petropoulos | 96/91 D |
| 4,123,276 | 10/1978 | Kita et al. | 430/176 |

FOREIGN PATENT DOCUMENTS 861871  3/1961  United Kingdom .

*Primary Examiner*—Charles L. Bowers, Jr.
*Attorney, Agent, or Firm*—Cushman, Darby & Cushman

[57] ABSTRACT

A photosensitive composition is prepared comprising a diazonium compound and a polymer containing at least 50% by weight of the recurring unit represented by the following general formula (I):

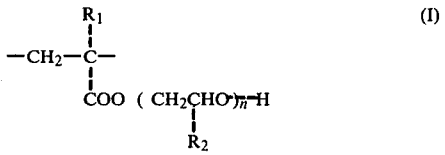

wherein $R_1$ represents hydrogen atom or methyl group, $R_2$ represents hydrogen atom or a methyl, ethyl or chloromethyl group and n is an integer of 1 to 10.

14 Claims, No Drawings

PHOTOSENSITIVE DIAZONIUM COMPOUND CONTAINING COMPOSITION AND ARTICLE WITH β-HYDROXYALKYL ACRYLATE OR METHACRYLATE

This is a continuation of application Ser. No. 489,434 filed July 17, 1974, now abandoned.

This invention relates to a photosensitive composition and, particularly, to a photosensitive composition used for the perparation of a photosensitive or presensitized planographic plate. The great majority of photosensitive substances which have been used as a photosensitive layer of a presensitized printing plate are diazonium compounds. The most commonly used are diazo resins represented, for example, by a condensate of p-diazodiphenylamine with formaldehyde. Such diazo resins are commercially available, e.g., under the trade name of Diazolys #1 (Ringwood Chemical Corp.) and Diazo Resin #4 (Fairmount Chemical Corp.). When such a diazo resin is applied to a paper, plastic film, metallic sheet or like appropriate support and exposed to actinic light through a negative transparency, the exposed part of the diazo resin is insolubilized due to the decomposition of the diazo resin. On the other hand, the unexposed area is washed off with water, whereupon the surface of the support is revealed. In case there is used a support having a surface pretreated to render it hydrophilic, the unexposed area reveals this hydrophilic surface upon development. Thus, on an off-set printing press, this area attracts water and repels an ink, while the decomposed diazo resin in the exposed area exhibits oleophilic properties and attracks ink and repels water. Namely, such printing materials provide so called negative-working printing plates.

Photosensitive compositions used in this type of photosensitive printing material may be divided into two groups: one comprising a diazo resin alone and containing no carrier as disclosed in U.S. Pat. No. 2,714,066 and the other comprising a blend of a diazo resin and a carrier as disclosed in U.S. Pat. No. 2,826,501 and British Pat. No. 1,074,392. In the former case, since no carrier is used, the thickness of the photosensitive layer is about 20 to about 100 mg/m$^2$, so that it is necessary to reinforce the image area to enhance its abrasion resistance and printing durability. Usually, concurrently with or subsequently to the developing step, an emulsified lacquer is applied to the image area to deposit thereon a resinous protective film thereby to make the printing plate able to endure various frictional and peeling-off forces encountered during the printing of numerous sheets of printed matter. A lacquer to be used for this purpose must have excellent abrasion resistance, firmly adhere to the image area of a plate and never yield scums and dregs. Many proposals for such lacquers have been made as disclosed, for example in U.S. Pat. No. 2,754,279. However, the application of a lacquer, which is usually done by the users of printing materials, requires considerable skill because the quality of a printing plate depends greatly on whether the lacquer is applied well or poorly. To eliminate the aforesaid drawbacks, it was previously proposed to incorporate a resin having good abrasion resistance into a photosensitive layer together with a photosensitive substance and to harden the incorporated resin with a photodecomposed diazonium compound, as disclosed, for example, in U.S. Pat. No. 2,826,501 and British Pat. No. 1,074,392. Specifically, a resin corresponding to the aforesaid lacquer is blended with a diazo resin, the blend is applied to a support in the necessary thickness, usually about 0.5 to about 5 g/m$^2$ as the coated amount, and, in the developing step, the unnecessary area, i.e., unhardened area, is removed by taking advantage of the difference in solubility or degree of swelling between the hardened area and the hardened area from the surface of the support to obtain a printing plate which is equal to or superior in quality to a printing plate prepared in the aforesaid way.

The resin to be incorporated with a diazo resin should be such that it has a good compatibility with the diazo resin and can be dissolved in an inexpensive common solvent with the diazo resin. Furthermore, the resin incorporated should be completely hardened by the photodecomposed product of the diazo resin into the insoluble state or yield a clear difference in solubility or swellability between the exposed area and the unexposed area. In addition, the resin used as a carrier should not have the property of deteriorating the storage stability of a blend with the diazo photosensitive substance. A certain water-soluble colloid forms, when used as a carrier for a diazo resin, a photoresist of a very good quality, but the resist is deteriorated after a few days to lose its photosensitivity by dark reaction. In the prior art, some proposals have been made with respect to carrier materials which satisfy the aforesaid requirements, though none of them fulfills all the requirements of hardening rate, printing durability, oleophilic properties and storage stability.

Therefore, it is an object of the present invention to provide a photosensitive composition suitable for use in preparing a photosensitive printing plate having an excellent mechanical strength throughout its photosensitive layer. A further object of the present invention is to provide a photosensitive composition having excellent storage stability.

It has been found that a photosensitive composition comprising a diazonium compound and a homopolymer of beta-hydroxy-alkyl acrylate or methacrylate or a copolymer containing at least about 50% by weight of beta-hydroxyalkyl acrylate or methacrylate units, or certain related polymers accomplishes these objects. Namely, the present invention comprises a photosensitive composition comprising a diazo compound and a polymer containing at least about 50% by weight of the recurring units represented by the following general formula (I):

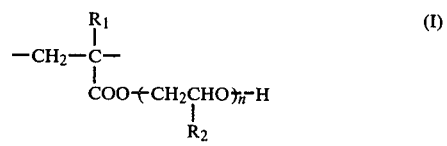

wherein $R_1$ represents hydrogen atom or methyl group, $R_2$ represents hydrogen atom or methyl, ethyl or chloromethyl group and n is an integer of 1 to 10.

The monomers employed to form the recurring units of formula I include hydroxyethyl acrylate, hydroxyethyl methacrylate, hydroxypropyl acrylate, hydroxypropyl methacrylate, hydroxybutyl acrylate, hydroxybutyl methacrylate, hydroxy-2-chloropropyl acrylate, hydroxy-2-chloropropyl methacrylate, diethylene glycol monoacrylate, diethylene glycol monomethacrylate, triethylene glycol monoacrylate, triethylene glycol monomethacrylate, tetraethylene glycol monoacrylate, tetraethylene glycol monomethacrylate, pentaethylene glycol monomethacrylate, decaethylene glycol monoacrylate, decaethylene glycol mono methacrylate, dipropylene glycol mono acrylate, dipropylene glycol monomethacrylate, tripropylene glycol monoacrylate, tripropylene glycol monomethacrylate, dibutylene glycol monoacrylate, dibutylene glycol monomethacrylate, di(2-chloropropylene glycol)acrylate, di(2-chloropropylene glycol)methacrylate.

The preferred monomer is hydroxyethyl methacrylate.

Negative-acting diazonium compounds, broadly, are diazo-aromatics, and more particularly are diazo-arylamines that can be substituted on the aromatic nucleus or on the aminonitrogen, preferably p-diazo-diphenylamine and derivatives thereof, for example, condensation products thereof with organic condensing agents containing reactive carbonyl groups such as aldehydes and acetals, particularly condensates with compounds such as formaldehyde, zinc chloride and paraformaldehyde. The preparation of such eminently suitable condensation products is disclosed in U.S. Pat. Nos. 2,992,715 and 2,946,683. The entire disclosures of these two U.S. patents is hereby incorporated by reference.

The foregoing diazonium compounds are reacted with suitable coupling agents to prepare reaction products that are at least partially soluble in organic solvents, preferably well soluble and that have light-sensitivity not substantially less than the starting diazo. The reaction products are only slightly water-soluble, if at all. Suitable coupling agents broadly are essentially organic compounds that react with the water-soluble diazonium compounds to reduce its ionic character and make it more covalent, do not reduce significantly its light-sensitivity, and produce a reaction product that is soluble in organic solvents but no more than only slightly water-soluble. Such coupling agents in general presently appear to be acidic aromatic compounds, for example, the phosphinic, phosphonic, sulfonic and carboxylic acids of benzene, toluene and naphthalene and their derivatives, for example, the alkali metal salts thereof; hydroxyl-containing aromatic compounds, e.g., phenolics such as diphenolic acid, benzophenone, substituted benzophenones, naphthols, naphthalene diols and alizarins, including sulfonic acids and alkali metal sulfonic acid salts thereof; and acidic aliphatic compounds such as stearic acid and ethylenediamine tetraacetic acid. Particularly suitable coupling compounds of the type described include toluene sulfonic acid, benzene phosphinic acid, 2,5-dimethyl-benzene sulfonic acid, benzene sulfonic acid sodium salt, nitrobenzene acetic acid, diphenolic acid, 2,3-naphthalene diol, naphthalene-2-sulfonic acid, 1-naphthol-2-(or 4-)sulfonic acid, 2,4-dinitro-1-naphthol-7-sulfonic acid, 2,4-dihydroxy-benzophenone, 2,2'-dihydroxy-4,4'-dimethoxybenzophenone, 2,2',4,4'-tetra-hydroxy-benzophenone, 2-hydroxy-4-methoxy-benzophenone-5-sulfonic acid, m-(p'-anilino-phenylazo)benzene sulfonic acid sodium salt, p-morpholino-benzene diazonium fluoborate, alizarin sodium-monosulfonate and o-toluidine-m-sulfonic acid. Some of these coupling agents and the preparation of coupled products thereof with light-sensitive diazonium compounds are disclosed in U.S. Pat. No. 3,300,309, and U.S. Pat. No. 3,591,575, the entire disclosures of these two U.S. patents being hereby incorporated by references.

The diazonium component and the coupling agent preferably are reacted together in approximately equimolecular quantities.

Other examples of suitable diazonium compounds include reaction products of the coupling agents described above with diazo resins such as condensates of 2,5-dimethoxy-4-p-tolylmercaptobenzenediazonium with formaldehyde and condensates of 2,5-dimethoxy-4-morpholinobenzenediazonium with formaldehyde or acetaldehyde, and compounds, as disclosed in Japanese Patent Application laid open to public inspections No. 33907/1973, representing the following general formula:

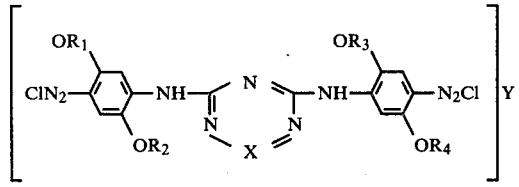

wherein:
$R_1$, $R_2$, $R_3$ and $R_4$ each represent an alkyl group containing 1 to 4 carbon atoms, such as methyl, ethyl, propyl or butyl;

X represents a substituted amino group, such as N-(beta-Hydroxyethyl)amino, N,N-di(beta-hydroxyethyl)amino or like hydroxyalkylamino group; and Y represents an anion of the coupling agent as described above; examples are: 2-methoxy-4-hydroxy-5-benzoyl benzenesulfonate of 2,6-bis(4-dizao-2,5-dimethoxyphenylamino)-4-N,N-(di-beta-hydroxyethyl)amino-1,3,5-triazine; 2-methoxy-4-hydroxy-5-benzoylbenzene-sulfonate of 2,6-bis(4-diazo-2,5-dimethoxyphenylamino)-4-N-(beta-hydroxyethyl)amino-1,3,5-triazine, and 2-methoxy-4-hydroxy-5-benzoylbenzenesulfonate of 2,6-bis(4-diazo-2,5-diethoxy-phenylamino)-4-N-(beta-hydroxyethyl)-amino-1,3,5-triazine.

Still other suitable diazonium compounds are those as disclosed in U.S. Pat. No. 2,649,373, the entire disclosure of which is hereby incorporated by reference.

The most preferred diazonium compound is 2-methoxy-4-hydroxy-5-benzoylbenzene sulfonic acid salt of the condensate of p-diazo-diphenylamine with formaldehyde.

The polymer containing at least about 50% by weight of the recurring units represented by the aforesaid general formula (I), to be used in the present invention, includes homopolymers as well as copolymers with other addition-polymerizable unsaturated compounds (e.g., ethylenically unsaturated compounds). The units of general formula I result from polymerizing compounds represented by the following general formula (II):

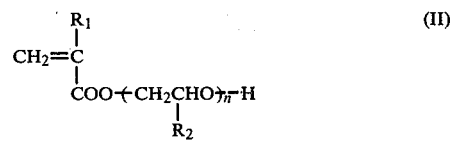

(II)

wherein: $R_1$, $R_2$, and n have the same meanings as designated with respect to the general formula (I).

The addition-polymerizable unsaturated compounds which can be compolymerized with the compounds of formula II include compounds containing a single addition-polymerizable unsaturated bond, such as organic acrylates, acrylamides, organic methacrylates, methacrylamides, allyl compounds, vinyl ethers, vinyl esters, organic crotonates, styrenes and the like. Examples are: organic acrylates, such as alkyl acrylates, e.g., methyl acrylate, ethyl acrylate, propyl acrylate, butyl acrylate, amyl acrylate, 2-ethylhexyl acrylate, octyl acrylate, tert.-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate, and aryl acrylates, e.g., phenyl acrylates; organic methacrylates, such as alkyl methacrylate, e.g., methylmethacrylate, ethylmethacrylate, propyl methacrylate, isopropyl methacrylate, butyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol methacrylate, glycidyl methacrylate, furfuryl methacrylate and tetrahydrofurfuryl methacrylate, and aryl methacrylates, e.g., phenyl methacrylate, cresyl methacryalte and naphthyl methacrylate; acrylamides, such as acrylamide itself, N-alkylacrylamides wherein the alkyl is, e.g., methyl, ethyl, propyl, butyl, t-butyl, heptyl, octyl, cyclohexyl, benzyl, or pentyl, N-hydroxyalkyl acrylamides, e.g., hydroxyethyl acrylamide, N-arylacrylamides wherein the aryl, e.g., phenyl or tolyl or naphthyl and N-hydroxyaryl acrylamides, e.g., hydroxyphenyl, p-nitrophenyl, N,N-dialkylacrylamides wherein the alkyl is e.g., methyl, ethyl such as dimethyl acrylamide, ethyl propyl acrylamide, diebutyl acrylamide, butyl, isobutyl, 2-ethylhexyl or cyclohexyl, N,N-diarylacrylamides wherein the aryl is, e.g., phenyl, e.g., N-methyl-N-phenylacrylamide, N-2-acetamidethyl-N-acetylacrylamide and the like; methacrylamides, such as methacrylamide itself, N-alkylmethacrylamides wherein the alkyl is, e.g., methyl, ethyl, tert-butyl, 2-ethylhexyl, hydroxyethyl and cyclohexyl, N-arylmethacrylamides wherein the aryl is, e.g., phenyl, N,N-dialkylmethacrylamides wherein the alkyl is, e.g., methyl, ethyl, propyl and/or butyl, e.g., dimethyl methacrylamide, dibutyl methacrylamide, N,N-diarylmethacrylamides wherein aryl is, e.g., phenyl, N-hydroxyethyl-N-methylmethacrylamide, N-methyl-N-phenylmethacrylamide and N-ethyl-N-phenylmethacrylamide; allyl compounds, such as allyl esters, e.g., allyl acetate, allyl caproate, allyl caprylate, allyl laurate, allyl palmitate, allyl stearate, allyl benzoate, allyl acetoacetate and allyl lactate, and allyoxyethanol; vinyl ethers, such as alkyl vinyl ethers, e.g., hexyl vinyl ether, octyl vinyl ether, decyl vinyl ether, 2-ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, vinyl methyl ether, diethyleneglycol vinyl ether, dimethylaminoethyl vinyl ether, butylaminoethyl vinyl ether, diethylaminoethyl vinyl ether, benzyl vinyl ether and tetrahydrofurfuryl vinyl ether, and vinyl aryl ethers and vinyl haloaryl ethers, e.g., vinyl phenyl ether, vinyl tolyl ether, vinyl chlorophenyl ether, vinyl 2,4-dichlorophenyl ether, vinyl naphthyl ether and vinyl anthranyl ether; vinyl esters, e.g., vinyl acetate, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl propionate, vinyl beta-phenylbutylate, vinyl cyclohexanecarboxylate, vinyl benzoate, vinyl salicylate, vinyl chlorobenzoate, vinyl tetrachlorobenzoate and vinyl naphthoate; styrenes, such as styrnee itself, alkylstyrenes, e.g., p-methylstyrene, o-methylstyrene, 2,4-dimethylstyrene, trimethylstyrene, p-ethylstyrene, 2,4-diethylstyrene, o-isopropylstyrene, p-butylstyrene, p-hexylstyrene, alpha methyl styrene, p-cyclohexylstyrene, decylstyrene, benzylstyrene, chloromethylstyrene, trifluoromethylstyrene, ethoxymethylstyrene and acetoxymethylstyrene, alkoxystyrenes, e.g., p-methoxystyrene, 4-methoxy-3-methylstyrene and dimethoxystyrene, and halogenostyrenes, e.g., p-chlorostyrene, 2,4-dichlorostyrene, trichlorostyrene, tetrachlorostyrene, pentachlorostyrene, p-bromostyrene, 2,4-dibromostyrene, iodostyrene, fluorostyrene, trifluorostyrene, 2-bromo-4-trifluoromethylstyrene and 4-fluoro-3-trifluoromethylstyrene; organic crotonates, such as alkyl crotonates, e.g., butyl crotonate, hexyl crotonate and glycerol monocrotonate; dialkyl itaconates, e.g., dimethyl itaconate, diethyl itaconate and dibutyl itaconate; dialkyl maleates and fumarates, e.g., dimethyl maleate, diethyl maleate, diethyl fumarate and dibutyl fumarate; acrylonitrile; methacrylonitrile; and the like. In addition, there can be used any addition-polymerizable unsaturated compounds capable of copolymerizing with the compound represented by the above general formula (II). However, addition-polymerizable unsaturated compounds having a functional group capable of reacting with the hydroxyl group of beta-hydroxyalkyl acrylates or methacrylates and polyfunctional addition-polymerizable unsaturated compounds having 2 or more polymerizable vinyl groups in the molecule are not preferred. A compound represented by the above general formula (II) is copolymerized with one or more of such addition-polymerizable unsaturated compounds as mentioned above to obtain the copolymerizates of the present invention. Among the comonomers to be copolymerized with a compound represented by the above general formula (II), those of relatively low oleophilic properties bring about a better result than those of relatively high oleophilic properties. Methyl methacrylate and acrylonitrile bring about the best results. Although a water-soluble addition-polymerizable unsaturated compound, such as acrylic acid, methacrylic acid, acrylamide or methacrylamide, is not preferred, it can be used in a small amount as the third component in combination with an other addition-polymerizable unsaturated compound to form a terpolymer. Addition-polymerizable unsaturated compounds having amino group are not preferred because their copolymers with a compound of the general formula (II) have a tendency to decompose diazo compounds.

The polymers used in the present invention can be prepared in the usual ways although the compounds of the general formula (II) preferably have a higher purity than the normally commercially available purity. Most commercial compounds contain up to about 1% by weight of polyfunctional addition-polymerizable unsaturated compounds, e.g., 0.1–0.3% of ethylene glycol dimethacrylate and about 0.5%, e.g., 0.05–0.2% by weight of free acrylic acid or methacrylic acid. The former impurity often causes gelation of the polymerization mixture and the latter has an adverse effect on the characteristics of a photosensitive plate prepared from the polymer and a diazonium compound.

The content of the compound of the above general formula (II) in the polymer of the present invention may vary within the range of from 100% by weight to about 50% by weight, preferably from about 80% by weight to about 65% by weight. The polymer desirably has a molecular weight within the range of from about 10,000 to about 100,000, preferably from about 30,000 to about 70,000, as determined by gel-permeation chromatography. However, this can be varied.

The polymer used in the present invention is insoluble in water but swollen by a solution of a water and wetting agent or water and alcohol or even water alone. When a combination of the polymerizate with a diazonium compound is contacted with a developing solution comprising water and a wetting agent, the polymer is swollen in the developing solution to exude an unhardened diazonium compound, and as a result, the combination in the unexposed area is removed to develop a relief image.

A polymer in which the content of the recurring units represented by the above general formula (I) is less than about 50% by weight gives a photosensitive plate which is difficult to be developed by a solution of water and wetting agent. Increase of the amount of a diazonium compound for improving the developing property causes a decrease of photosensitivity.

The diazonium compound is preferably used in an amount of about 5 to about 50% by weight based on the total weight of the polymer and diazonium compound. As the amount of a diazo compound decreases, the photosensitivity is enhanced but the developing property by a mixture including a water and wetting agent is degraded. The optimum amount of a diazonium compound is about 10 to about 30% by weight.

In the photosensitive composition of the present invention there can be incorporated another resin in an amount of up to about 50% by weight of the aforesaid polymer. As the other resin suitably there are used those having, e.g., hydroxyl, amide or urethane groups in the molecule and compatible with the aforesaid polymerizate, such as polyamide resins, e.g., nylon-6.10 copolymer, nylon-6, epoxy resin, e.g., bisphenol A-epichlorhydrin, polyurethane resins, e.g., polyethylene glycol Mol. Wt. 2000—toluene diisocyanate reaction product, and polyvinyl formal resin. By incorporation of such a resin there is obtainable some improvement in abrasion resistance. Improvements in some properties may be obtained by addition of dye, pigment, stabilizer, filler and other additives. Dyes which will be discolored during development or react with a diazo compound are unsuitable for use as a dye for enhancing the visual contrast between a support surface and an image area of a developed plate. Examples of the dyes which are suitable include oil-soluble dyes such as, e.g., Oil Blue #603 by Orient Kagaku Kogyo Kabushiki Kaisha, Eisen spiron blue GNH and Eisen Spiron Red 2BH supplied by Hodogaya Kagaku Kogyo Kabushiki Kaisha, Zapon Fast Fairly Red B supplied by Badische Anilin & Soda Fabrik A.G., Oil Orange (C.I. 12,055), Oil Black 2HB (C.I. 50,415), Oil Blue G Extra (C.I. 61,525), Oil Orange SS (C.I. 12,100), Oil Red (C.I. 26,105), Oil Red AS (C.I. 26,100), Oil Red XO (C.I. 12,140), Oil Violet (C.I. 26,050), Oil Yellow OB (C.I. 11,390), Oil Yellow BB (C.I. 11,020), Nigrosine Solvent Blue (C.I. 864), Spirit Blue CR (C.I. 689(, Oil Blue N, Oil Red 4B, Oil Bordeaux (Solvent Red 4), Oil Red B (Solvent Red 24), Indirubin (Solvent Blue 7), Oil Brown BB (Solvent Brown 5), Spirit Black (Solvent Black 5). A compound having the following general formula is preferable:

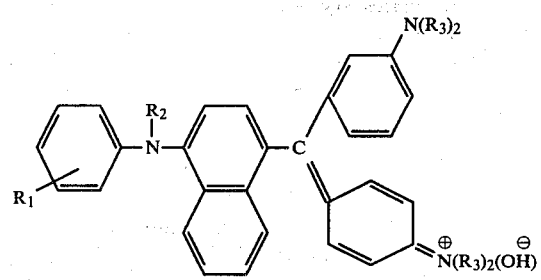

wherein $R_1$ represents hydrogen atom, an alkyl group, preferably, e.g., methyl group, or an alkoxy group, preferably, e.g., methoxy group, and $R_2$ and $R_3$ represent hydrogen atom or an alkyl group, preferably, e.g., a methyl or ethyl group. These oil soluble dyes may be incorporated with the composition usually in an amount of about 0.5 to about 10%, preferably about 2 to about 5% by weight based on the polymer. Thus, if these oil soluble dyes are incorporated with the composition, these dyes may be faded by exposure to actinic light.

The photosensitive composition of the present invention is suitable for use as a photosensitive layer of a photosensitive planographic plate. The suitable support includes, e.g., paper and sheets or foils of plastic such as polyvinyl acetate, zinc, copper, aluminum, stainless steel, surface-treated steel and like metals, and glass. The surface of a support is usually passivated to hinder a harmful interaction between the surface and a diazo compound prior to application thereto of a coating composition. The passivation treatment aids a firm bonding between the support and the exposed area of a coating and enhances the naked surface of the support during printing. The silicate treatment as disclosed in U.S. Pat. No. 2,714,066 is a suitable passivation process for metallic supports. The entire disclosure of this patent is incorporated by reference. Other passivating processes are treatment by an aqueous potassium fluorozirconate as disclosed in U.S. Pat. No. 2,946,683, phosphomolybdate treatment as disclosed in U.S. Pat. No. 3,201,247, and silicate electro-deposition as disclosed in U.S. Pat. No. 3,658,662. Still another process is a silicate treatment following an anodic oxidation in phosphoric or sulfuric acid as described in U.S. Pat. No. 3,181,461. The entire disclosures of the 5 patents just mentioned are incorporated by reference.

The amount of the photosensitive composition applied to a support can range from about 0.5 to 5 g/m², preferably from about 0.5 to about 2.5 g/m² and most preferably about 0.7 to about 1.5 g/m².

A photosensitive planographic plate in which there is used the photosensitive composition of the present invention, when exposed through a negative transparency to actinic light, changes the solubility of the photosensitive layer in the exposed area and results in a difference in degree of swelling by a developing solution. Development is performed by contacting the photosensitive layer with a developing solution comprising an aqueous solution of a wetting agent. A preferred developing solution is an aqueous solution of sodium lauryl sulfate of industrial grade sold under the trade name of MON- OGEN Y-100 by Dai-ichi Kogyo Seiyaku Kabushiki Kaisha, Japan. Examples of other useful wetting agents are sodium-lauryl, lauryl benzene sulfonate, sodium octyl sulfate, ammonium lauryl sulfate, sodium xylenesulfonate, monosodium N,N-dihydroxyglycine and the like. As the concentration of the wetting agent increases the developing time decreases. The wetting agent is used in a concentration of about 0.005 to about 30%, preferably about 0.5 to about 10%, more desirably about 2 to about 6% by weight. The aqueous wetting agent developing solution can remove the photosensitive composition in the unexposed area without removal in the exposed area or with only slight removal in the exposed area. To the wetting agent solution there can be added sodium silicate, magnesium sulfate, magnesium nitrate or like compound in an amount of about 0.1 to about 10%, preferably about 0.5 to about 2% by weight based on the total weight of the developing solution to keep the blanket of a press clean during printing. Developing latitude in development can be broadened by addition to the developing solution of a small amount of a water-miscible organic solvent such as benzyl alcohol.

The photosensitive composition of the present invention can be used in the preparation of photoresist materials and photo masks, too.

Hereinafter, some embodiments of the present invention will be illustrated in more detail by the following examples, in which all percents are by weight.

EXAMPLE 1

180 g of 2 methoxyethanol was heated in a stream of nitrogen gas at 100° C. and a mixture of 100 g of beta-hydroxyethyl methacrylate and 0.75 g of benzoy peroxide was added dropwise thereto over 2 hours. To the reaction mixture there was then added dropwise a mixture of 20 g of 2-methoxyethanol and 0.25 g of benzoyl peroxide over 15 minutes. The reaction was continued at 100° C. for an additional 3 hours to obtain a methoxyethanol solution of poly(beta-hydroxyethyl methacrylat) having a non-volatile matter content of 32%. The viscosity of this solution was 1,500 cps.

A 2S aluminum sheet was immersed for 3 minutes in a 10% aqueous solution of tertiary sodium phosphate maintained at 80° C. to degrease it, washed with water, and then desmutted by means of a 70% aqueous nitric acid, washed with water, immersed for 1 minute in a 3% aqueous solution of sodium silicate maintained at 70° C. washed with water and dried. A photosensitive solution of the following composition was applied to the smooth-surfaced aluminum sheet thus pretreated by means of a wire and dried at 100° C. for 2 minutes.

| | |
|---|---|
| 32% Solution in 2-methoxyethanol of poly (beta-hydroxyethyl methacrylate) | 2.40 g |
| An acrylic urethane compound prepared by reacting Coronate L (trade name of an adduct of 3 moles of 2,4-toluene diisocyanate to one mole of trimethylol-propane, supplied by Nippon Polyurethane Kogyo Kabushiki Kaisha, with beta-hydroxyethyl acrylate in the equal proportions with respect to functional groups, i.e., NCO:OH = 1:1. | 0.20 g |
| 2-Methoxy-4-hydroxy-5-benzoylbenzene-sulfonate of a condensate of p-diazodiphenylamine with para formaldehyde | 0.20 g |
| Oil Blue #603 (Orient Kagaku Kogyo Kabushiki Kaisha). | 0.03 g |
| 2-Methoxyethanol | 20.00 g |
| Methanol | 5.00 g |

The weight of dried coating was 0.98 g/m$^2$. The photosensitive planographic plate was exposed for 30 seconds to a carbon arc lamp of 30 Amp. located 70 cm apart from the plate, immersed at room temperature for 1 minutes in a developing solution of the following composition and the unexposed area removed by lightly rubbing it with an absorbent cotton to obtain a planographic plate.

| | |
|---|---|
| Benzyl alcohol | 20.00 g |
| 40% aqueous solution of sodium silicate | 10.00 g |
| Monogen Y - 100 | 30.00 g |
| Water | 940.00 g |

When printing was carried out using the plate mounted on a press, the plate exhibited good olephilic properties in the image area and gave printed matter with a very good reproducibility.

EXAMPLE 2

A conical flask was charged with 70 g of beta-hydroxyethyl methacrylate, 30 g of methyl methacrylate, 0.5 g of benzoin ethyl ether and 200 g of dioxane and exposed for 4 hours to outdoor sunlight to synthesize a beta-hydroxyethyl methacrylate/methyl methacrylate copolymer. The copolymer solution thus obtained had a non-volatile matter content of 31% and the average molecular weight of the copolymer determined by gel permeation chromatography was 55,000.

To the same silicate-treated smooth-surfaced aluminum sheet as used in Example 1 and to an aluminum sheet which had been subjected to silicate treatment under the same condition as in Example 1 and to an aluminum sheet which had been subjected to silicate treatment under the same condition as in Example 1, after sandblasting there was applied a photosensitive solution of the following composition.

| | |
|---|---|
| 31% Dioxane solution of beta-hydroxyethyl methacrylate methyl methacrylate = 70/30 copolymer | 3.00 g |
| The same diazo resin as used in Example 1 | 0.20 g |
| Oil Blue #603 | 0.03 g |
| 2-Methoxyethanol | 20.00 g |
| Methanol | 5.00 g |
| Ethylene dichloride | 5.00 g |

The weight of dried coating after coating at 100° C. for 2 minutes of the photosensitive layer thus formed was 1.02 g/m$^2$ in case of the smooth-surfaced aluminum sheet support and 1.20 g/m$^2$ in case of the sand matted aluminum sheet support. The photosensitive planographic plates were exposed for 40 seconds to a carbon arc lamp of 30 Amp. located 70 cm apart from the plate and developed at room temperature for 1 minutes by immersing them in a developing solution of the following composition:

| | |
|---|---|
| Benzyl alcohol | 5.00 g |
| Magnesium sulfate heptahydrate | 15.00 g |
| Citric Acid | 5.00 g |
| Monogen Y - 100 | 30.00 g |
| Water | 945.00 g |

After development, the plates were lightly rubbed with absorbent cotton to remove unexposed areas. The printing plate just developed and washed with water was mounted on a Ro ta press (Nippon Jimuki Kabushiki Kaisha) and printing was carried out. On this occasion, there were obtained fine prints except for the initial 5 or 6 sheets. In the case of the smooth-surfaced support the printing durability was 18,000 and in the case of the sand matted support it was 47,000 sheets. It was found that the printing durability could be enhanced by about 50% by drying the developed and washed plate at 100° C. for 5 minutes.

In another test, developing was carried out using, in place of the aforesaid acidic developing solution, an alkaline developing solution of the following composition.

| | |
|---|---|
| 40% Aqueous sodium silicate | 10.00 g |
| Monogen Y - 100 | 20.00 g |
| Water | 970.00 g |

The printing durability of the printing plate thus obtained and having a smooth-surfaced aluminum sheet support was 15,000 sheets and thus was lower than that of a printing plate developed by the aforesaid acidic developing solution. However, a blanket on the non-image area was less soiled by the plate developed by the alkaline developing solution containing sodium silicate than by the plate developed by the alkaline developing solution.

EXAMPLE 3

A beta-hydroxyethyl methacrylate methyl methacrylate=50/50 copolymer was synthesized in a similar manner to that in Example 2. The non-volatile matter content of the copolymer solution was 31% and the average molecular weight as determined by a gel permeation chromatography of the copolymer was 30,000.

To the same silicate-treated smooth-surfaced aluminum sheet as in Example 2 there was applied a photosensitive solution of the following composition.

| | |
|---|---|
| 31% Dioxane solution of beta-hydroxyethyl methacrylate/methyl methacrylate = 50/50 copolymer | 3.00 g |
| Diazo resin as used in Example 1 | 0.40 g |
| 2-Methoxyethanol | 2.00 g |
| Methanol | 5.00 g |
| Ethylene dichloride | 5.00 g |

The coated aluminum sheet was dried at 100° C. for 2 minutes to obtain a photosensitive planographic plate having a photosensitive layer having a weight of dried coating of 0.79 g/m².

The photosensitive plate was exposed through a transparency for 100 seconds to a carbon arc lamp of 30 Amp. located 70 cm apart from the plate and immersed at room temperature for 1 minute in the following developing solution to obtain a printing plate.

| | |
|---|---|
| Benzyl alcohol | 30.00 g |
| n-Propyl alcohol | 20.00 g |
| 85% Phosphoric acid | 10.00 g |
| Magnesium sulfate heptahydrate | 10.00 g |
| Monogen Y-100 | 20.00 g |
| Water | 910.00 g |

The printing plate exhibited improved oleophilic properties in the image area compared to the printing plate of Example 2, through the sensitivity of the photosensitive plate of this example was one half or less that of the photosensitive plate of Example 2.

EXAMPLE 4

To the same silicate-treated smooth-surfaced aluminum sheet as in Example 2 there was applied the following photosensitive solution:

| | |
|---|---|
| 31% Dioxane solution of beta-hydroxyethyl methacrylate/methyl methacrylate = 70/30 Copolymer of Example 2 | 2.00 g |
| Ultramide IC alcoholic soluble polyamide, supplied by Badishe Aniline und Soda Fabrik., A.G., West Germany | 0.20 g |
| Diazo resin as used in Example 1 | 0.20 g |
| 2-methoxyethanol | 10.00 g |
| Methanol | 10.00 g |
| Ethylene dichloride | 10.00 g |
| Oil Blue #603 | 0.04 g |

The coated sheet was dried at 100° C. for 2 minutes to obtain a photosensitive planographic plate having a photosensitive layer with a dried coating weight of 0.82 g/m².

The photosensitive plate was exposed to a carbon arc lamp of 30 Amp. located 70 cm apart from the plate for 40 seconds and developed by immersing at room temperature for 1 minute in the following developing solution.

| | |
|---|---|
| Benzyl alcohol | 5.00 g |
| 40% Aqueous sodium silicate | 10.00 g |
| Monogen Y - 100 | 30.00 g |
| Water | 955.00 g |

The printing plate thus obtained was superior in toughness of the resist in the image area and in the oleophilic properties to the printing plate from the smooth-surfaced aluminum sheet in Example 2 and exhibited a printing durability on a Ro ta press of 18,000 sheets or more.

EXAMPLE 5

In this example, there was employed, in place of the diazo resin of Example 2, a diazonium compound of the following structural formula:

Complex salt of:

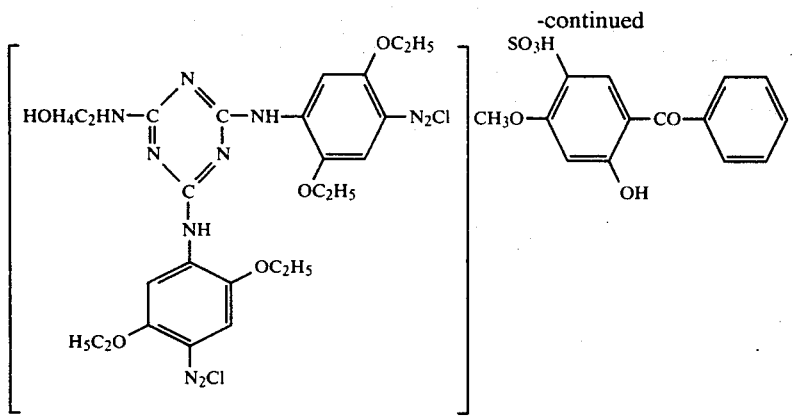
-continued
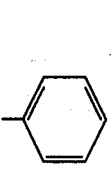

The same procedure as in Example 2 was followed except for the diazo compound employed to obtain a printing material having a photosensitive layer with a dry coating weight of 0.96 g/m².

The printing material was exposed for 40 seconds to a carbon arc lamp of 30 Amp. located 70 cm apart therefrom and developed by immersing it at room temperature for 1 minute in the same developing solution containing sodium silicate as used in Example 4 to obtain a printing plate which was somewhat inferior in its oleophilic property but comparable in the other properties to the printing plate prepared from the smooth-surfaced aluminum sheet in Example 2.

EXAMPLE 6

A conical flask was charged with 60 g of monomethacrylate of a poly(oxypropylene) glycol of an average molecular weight of 250, 40 g of methyl methacrylate, 1 g of benzoin ethyl ether as a photopolymerization initiator and 200 g of dioxane as a solvent and exposed for 4 days to outdoor sunlight to prepare a poly(oxypropylene)glycol monomethacrylate—methyl methacrylate copolymer solution with a non-volatile matter content of 30.5%.

To the same silicate-treated smooth-surfaced aluminum sheet as used in Example 1 there was applied the following photosensitive solution. The application and drying of the photosensitive solution were carried out under the same manner as in Example 1.

| | |
|---|---|
| 30.5% Dioxane solution of poly(oxypropylene) glycol monomethacrylate copolymer | 3.00 g |
| Diazo resin of Example 1 | 0.40 g |
| 2-Methoxyethanol | 20.00 g |
| Methanol | 5.00 g |
| Ethylene dichloride | 5.00 g |

The dry coating weight was 1.06 g/m². The photosensitive planographic plate was exposed imagewise for 60 seconds to a carbon arc lamp of 30 Amp. located 70 cm apart therefrom, then soaked at room temperature for 1 minute in the same acidic developing solution as in Example 2 and lightly rubbed by absorbent cotton for removal of the unexposed area to obtain a planographic plate. The printing plate, on a press, exhibited good oleophilic properties in the image area and gave fine prints with a high reproducibility.

What is claimed is:

1. A photosensitive composition of the negative type consisting essentially of a mixture of a negative acting diazonium compound and a polymer containing 50 to 100% by weight of the recurring unit represented by the following general formula (I) based on the total weight of the polymer:

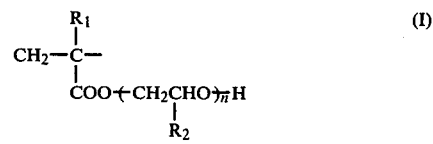

wherein $R_1$ represents hydrogen atom or methyl group, $R_2$ represents hydrogen atom or methyl, ethyl or chloromethyl group and n is an integer of 1 to 10 with the balance of the units, if any, consisting essentially of units of a monoethylenically unsaturated compound having a single addition polymerizable unsaturated bond and free of groups reactive with a hydroxyalkyl group, said polymer having a molecular weight within the range of from about 10,000 to 100,000, said monoethylenically unsaturated compound being an organic acrylate or methacrylate, acrylamide, methacrylamide, mono or di-N-alkyl, cycloalkyl or aryl acrylamide or methacrylamide, hydroxyalkyl acrylamide or methacrylamide, monoallyl ester or ether monovinyl ethers, vinyl ester, styrene, alkylstyrene, halostyrene, halomethyl styrene, alkoxyalkyl styrene, alkyl crotonate, dialkyl itaconate, dialkyl maleate, dialkyl fumarate, acrylonitrile or methacrylonitrile, said diazonium compound being present in an amount of about 10 to 30% by weight based on the total weight of the polymer and diazonium compound.

2. A photosensitive composition according to claim 1 wherein n is 1.

3. A photosensitive composition according to claim 1 wherein said polymer is a copolymer of 65 to 80% by weight of a compound represented by the following general formula (II) based on the weight of a total monomer:

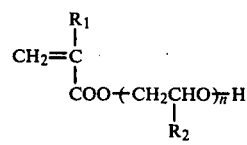

wherein $R_1$ represents a hydrogen atom or methyl group, $R_2$ represents a hydrogen atom or methyl, ethyl or chloromethyl groups and n is an integer of 1 to 10.

4. A photosensitive composition according to claim 1, wherein said diazonium compound is a diazonium aromatic compound.

5. A photosensitive composition according to claim 4, wherein said diazonium compound is soluble in organic solvents but only slightly water-soluble.

6. A composition according to claim 1 wherein the polymer is a copolymer of the compound providing the units of formula I and an alkyl acrylate or alkyl methacrylate.

7. A composition according to claim 6 wherein the polymer is a copolymer of the compound providing the units of formula I and methyl methacrylate.

8. A composition according to claim 7 wherein the polymer is a copolymer of hydroxyethyl methacrylate and methyl methacrylate.

9. A composition according to claim 1, wherein the polymer is essentially hydroxyethyl methacrylate homopolymer.

10. A presensitized printing plate having a photosensitive layer consisting essentially of the composition of claim 1 on a support.

11. A presensitized printing plate according to claim 10, wherein said layer is provided with the composition in amount of 0.5 to 5 g/m$^2$.

12. A presensitized printing plate according to claim 10, wherein the support is a sheet or foil selected from the group consisting of paper, plastic, metal and glass.

13. A presensitized printing plate according to claim 12, wherein said support is aluminum.

14. A presensitized printing plate according to claim 13, wherein the surface of said aluminum is a passivatably treated surface.

* * * * *